United States Patent
Hsu

(10) Patent No.: US 7,129,146 B2
(45) Date of Patent: Oct. 31, 2006

(54) FLIP CHIP PACKAGE AND PROCESS OF FORMING THE SAME

(75) Inventor: Chi-Hsing Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 62 days.

(21) Appl. No.: 10/987,167

(22) Filed: Nov. 12, 2004

(65) Prior Publication Data

US 2005/0253275 A1 Nov. 17, 2005

(30) Foreign Application Priority Data

May 13, 2004 (TW) ................................ 93113402 A

(51) Int. Cl.
*H01L 21/76* (2006.01)
(52) U.S. Cl. ...................... 438/401; 438/462
(58) Field of Classification Search ................ 438/401, 438/462
See application file for complete search history.

(56) References Cited

U.S. PATENT DOCUMENTS

| 6,278,193 B1 * | 8/2001 | Coico et al. ................. 257/797 |
| 7,005,754 B1 * | 2/2006 | Howarth ...................... 257/797 |
| 2005/0014348 A1 * | 1/2005 | Rumsey et al. ............. 438/462 |

* cited by examiner

*Primary Examiner*—Roy Potter
(74) *Attorney, Agent, or Firm*—J.C. Patents

(57) ABSTRACT

A flip chip package and a process of forming the same are disclosed. After aligning a chip on a circuit substrate according to the fiducial marks formed on the circuit substrate, a barrier material block is disposed on each of the fiducial marks. Thereafter, a fixing treatment, such a reflow or a curing treatment, is performed to transform the barrier material blocks into barrier layers for covering the fiducial marks respectively. The barrier layers are adapted for resisting exposure of fiducial marks from external air or moisture to reduce the possibility of fiducial marks from being oxidized. Thus, the reliability and the aesthetic appearance of the flip chip package can be effectively promoted.

12 Claims, 4 Drawing Sheets

FLIP CHIP PACKAGE AND PROCESS OF FORMING THE SAME

CROSS-REFERENCE TO RELATED APPLICATION

This application claims the priority benefit of Taiwan application Ser. No. 93113402, filed on May 13, 2004.

BACKGROUND OF THE INVENTION

1. Field of the Invention

The present invention relates to a flip chip package, and in particular, to a flip chip package and a process of forming the same, for preventing fiducial marks of a circuit substrate being oxidized.

2. Description of the Related Art

Following the increase of input/output contacts of an integrated circuit, chip package technology has become more and more diversified. This is due to the fact that Flip Chip (FC) Interconnect technology minimizes the size of the chip package, and reduces signal transmission path, etc. Currently, flip chip interconnect technology is widely employed in the field of chip package, for instance, Chip Scale Package (CSP), Direct Chip Attached (DCA) package, and Multi-Chip Module (MCM) package, etc. Flip chip interconnect technology is employed in achieving the objective of chip package.

Flip chip interconnect technology employs the method of defining area array by disposing a plurality of solder pads onto the active surface of the chip and forming bumps on the solder pads, respectively. Next, the chip is then flipped to connect the plurality of bumps on the chip to a plurality of bump pads on the circuit substrate respectively so that the chip and the circuit substrate are electrically and mechanically connected via these bumps, and the chip can be further indirectly electrically connected to external electronic devices via the internal circuits of the circuit substrate. In addition, a plurality of fiducial marks is formed on the surface of the circuit substrate that faces the chip. The fiducial marks provide positioning reference between the chip and the circuit substrate so that the connection between the chip and the circuit substrate is accurate.

FIG. 1A is a top view of a conventional flip chip package, and FIG. 1B is a sectional view along line A–A' of FIG. 1A. Chip 110 is connected by a flip chip interconnect method. By disposing a plurality of bumps 130 (only one being shown) on the carrier surface 122 of the circuit substrate 120, the circuit substrate 120 is provided with a plurality of bump pads 124 (only one being shown) and a plurality of fiducial marks 126. These bump pads 124 are generally disposed on the center of the carrier surface 122. The fiducial marks 126 are generally disposed at the four ,comers of the carrier surface 122. These bumps 130 are respectively connected between the solder pads 112 of the chip 110 and the bump pads 124 on the circuit substrate 120. Further, a solder mask 128 is disposed on the carrier surface 122 of the circuit substrate 120, and a plurality of openings 128a, 128b of the solder mask 128 expose the bump pads 124 and the fiducial marks 126, respectively. Due to the openings 128a, 128b exposing the bump pads 124 and the fiducial marks 126 to the external environment, and in order to prevent the bump pads 124 and the fiducial marks 126 from long contact with the air, a plurality of protective layers 152 is formed on the bump pads 124 and the fiducial marks 126 respectively.

Referring to FIG. 2, a sectional view of a conventional circuit substrate is shown. The openings 128a, 128b of the solder mask 128 expose the bump pads 124 and the fiducial marks 126 of the circuit substrate 120 respectively, and solder blocks 154 are formed on the bump pads 124 and the fiducial marks 126, respectively. Thus, similarly, by means of the solder blocks 154 on the fiducial marks 126, the isolation of the solder block 154 with the fiducial marks 126 and the external environment can be achieved. Other solder blocks 154 on the bump pads 124, after a reflow treatment, can connect the bumps (indicated as 130 in FIG. 1B) to the bump pad 124, respectively. However, the solder blocks 154 on the fiducial marks 126 have ball shaped surface and when image monitoring system is employed to position the chip (reference number 110 in FIG. 1B) and the circuit substrate 120, the image monitoring system, for instance a CCD camera, may be affected by one or more of the protruded solder blocks 154 on the fiducial marks 126 such that one or more positions of the fiducial marks 126 cannot be accurately detected by the image monitoring system. Thus, the position between the chip (reference 110 of FIG. 1B) and the circuit substrate 120 cannot be accurately made.

Referring to FIG. 3, a sectional view of another conventional circuit substrate is shown. In order to mitigate the shortcoming for being unable to accurately position the chip to the circuit substrate due to the protruded solder blocks 154, the surface of the fiducial marks 126 are respectively improved by covering a substantially flat organic surface protection layer (OSP layer) 156 to isolate the fiducial marks 126 from the external environment. However, the OSP layer 156 will disappear at the reflow treatment or other curing treatment. At this instance, these fiducial marks 126 will be again directly exposed to the external environment. Thus the fiducial marks 126 is subjected to oxidation with atmospheric oxygen and or moisture.

It should be noted that the fiducial marks are formed from the outer circuit layer of the circuit substrate. Thus, when the material of the circuit layer of the circuit substrate is copper, after the flip chip package fabrication process is completed, i.e., after the chip is mounted on the circuit substrate, the exposed fiducial marks of the circuit substrate will be oxidized to form green colored copper oxide. This will damage the aesthetic appearance of the package. Besides, moisture of the external environment will enter the interior of the circuit substrate via the oxidized region of the exposed fiducial marks. Thus, short circuits will occur in the interior of the circuit substrate, which cause a failure to the circuit substrate.

SUMMARY OF THE INVENTION

Accordingly, the present invention is directed to a flip chip package, wherein the fiducial marks of the circuit substrate are covered with a barrier for resisting exposure of the fiducial marks to atmospheric oxygen or moisture so as to reduce the possibility of the fiducial marks from being oxidized and thereby maintain the aesthetic appearance of the circuit substrate and ensure normal operation of the circuit substrate.

The present invention is also directed to a flip chip package process, wherein after the chip is properly positioned on the circuit substrate according to a plurality of fiducial marks, a barrier layer is formed for covering the fiducial marks in order to resist the exposure of the fiducial marks to the external oxygen or moisture so as to maintain the aesthetic appearance of the circuit substrate, and to ensure normal operation of the circuit substrate. Thus, the reliability of the flip chip package can be effectively promoted.

According to an embodiment of the present invention, a flip chip package comprising a circuit substrate, a chip and a plurality of barriers is provided. The circuit substrate has a carrier surface and a plurality of fiducial marks, and the carrier surface is provided with a chip connection region. These fiducial marks are formed on the carrier surface and are positioned outside the chip connection region. The chip is positioned with respect to the chip connection region according to the fiducial marks. The barrier layers are formed for covering the fiducial marks, and the barrier layers are formed after the chip is positioned at the chip connection region.

In view of the above, barrier layers can be adapted for covering the fiducial marks of the circuit substrate so as to resist the exposure of the fiducial marks to the atmospheric oxygen or moisture and thereby reduce the possibility of the fiducial marks from being oxidized by the atmospheric oxygen or moisture. Further, as described above, because the barrier layers can be formed during either the reflow treatment of the bumps or curing treatment of the underfill, therefore no extra step or special process/equipment is required for forming the barrier layers. Thus, the barrier layers can be utilized to effectively reduce the possibility of the fiducial marks from being oxidized by the external oxygen or moisture. Therefore, the reliability of the circuit substrate of the flip chip package can be effectively promoted, and the aesthetic appearance of the circuit substrate of the flip chip package can be effectively maintained.

DESCRIPTION OF THE DRAWINGS

The accompanying drawings are included to provide a further understanding of the invention, and are incorporated in and constitute a part of this specification. The drawings illustrate embodiments of the invention and, together with the description, serve the principles of the invention.

DESCRIPTION OF EMBODIMENTS

Figure 1A:
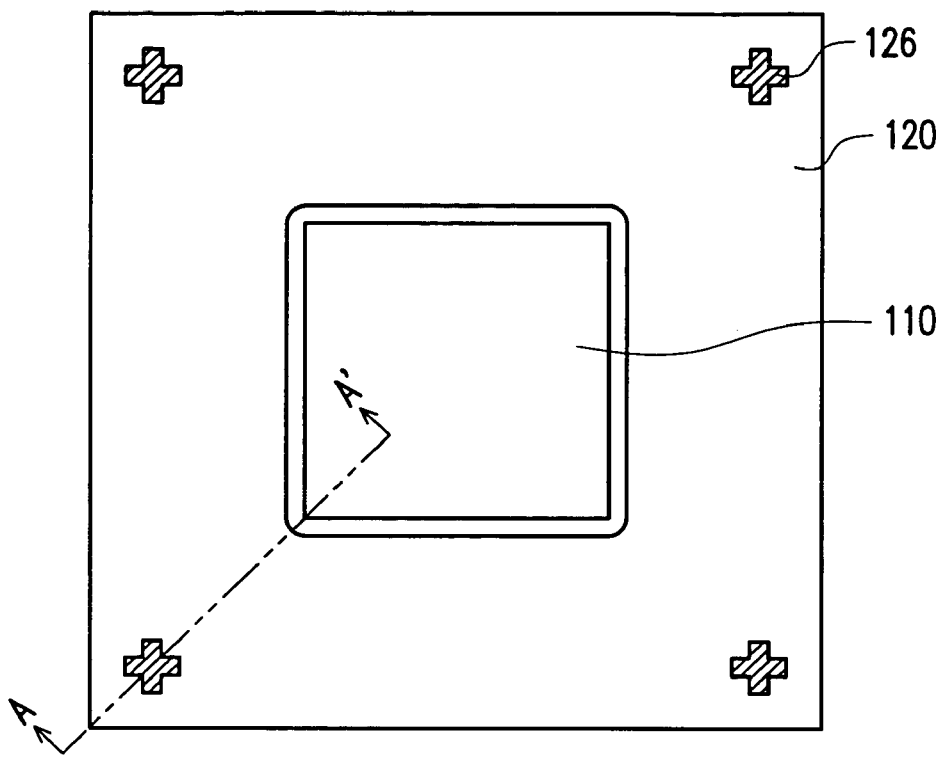
FIG. 1A is a bottom view of a conventional flip chip package.
Figure 1B:
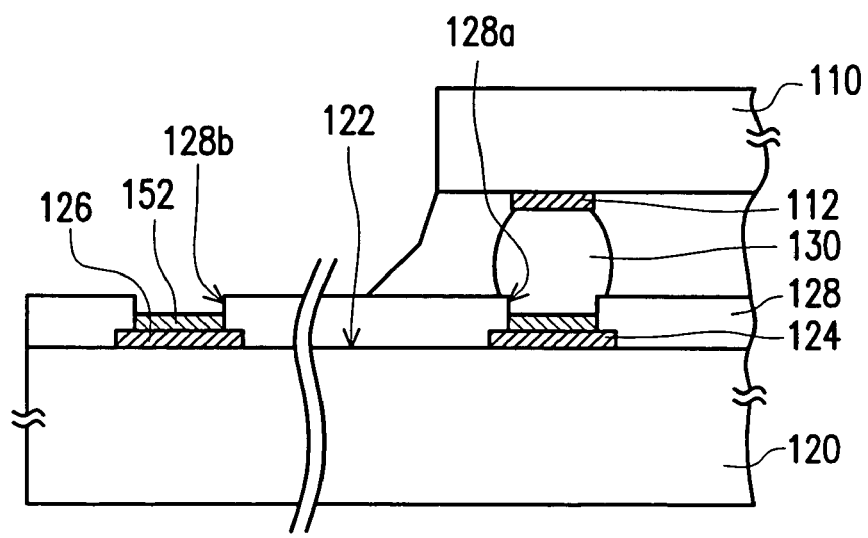
FIG. 1B is a sectional view along line A–A' of FIG. 1.
Figure 2:
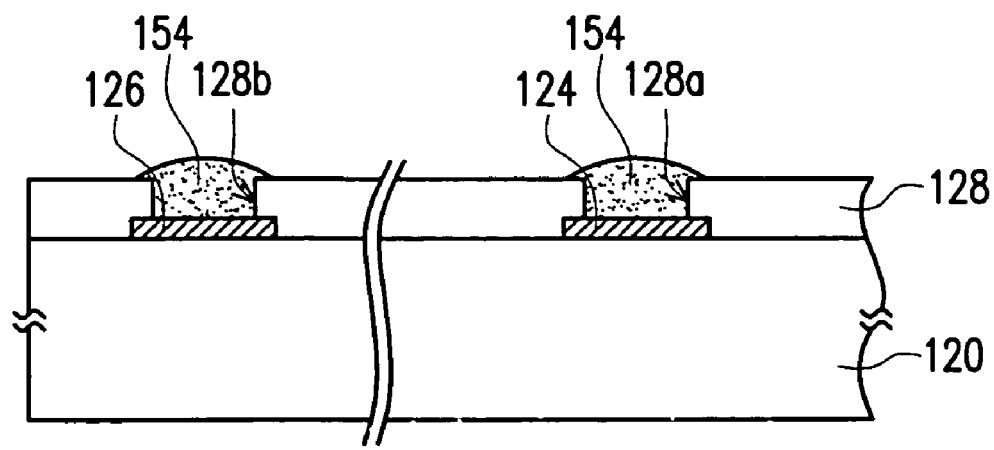
FIG. 2 is a partial sectional view of another conventional circuit substrate.

Reference will now be made in detail of the present preferred embodiments of the invention, examples of which are illustrated in the accompanying drawings. Wherever possible, the same reference numbers are used in the drawings and the description to refer to the same or like parts.

Figure 4A:
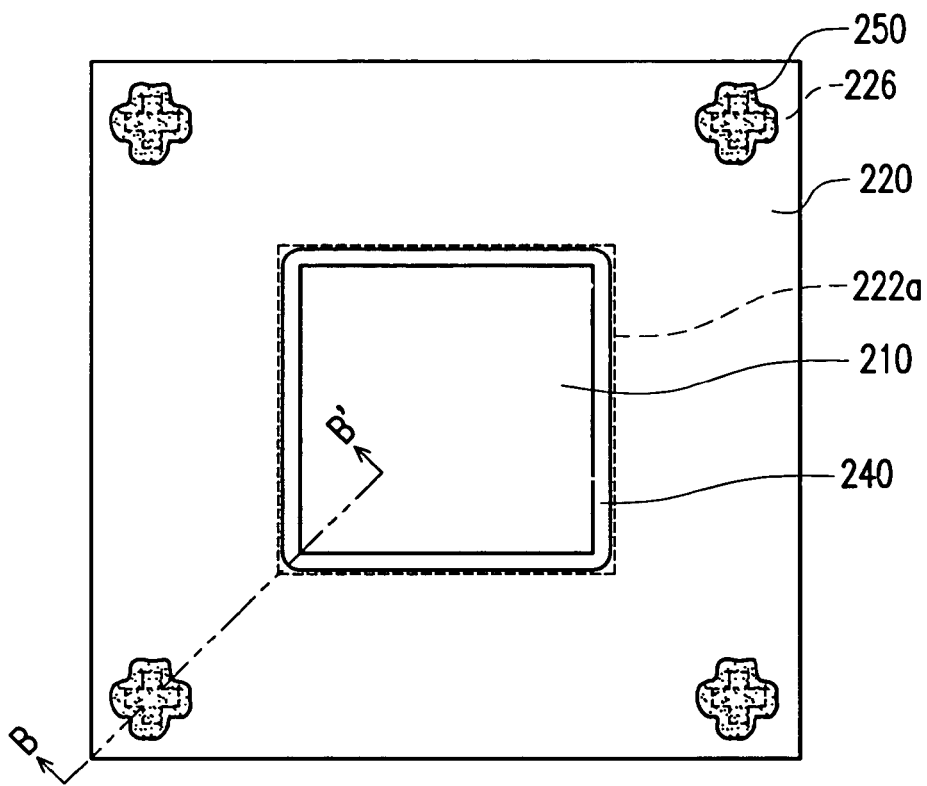
FIG. 4A is the bottom view of a flip chip package in accordance with an embodiment of the present invention.
Figure 4B:
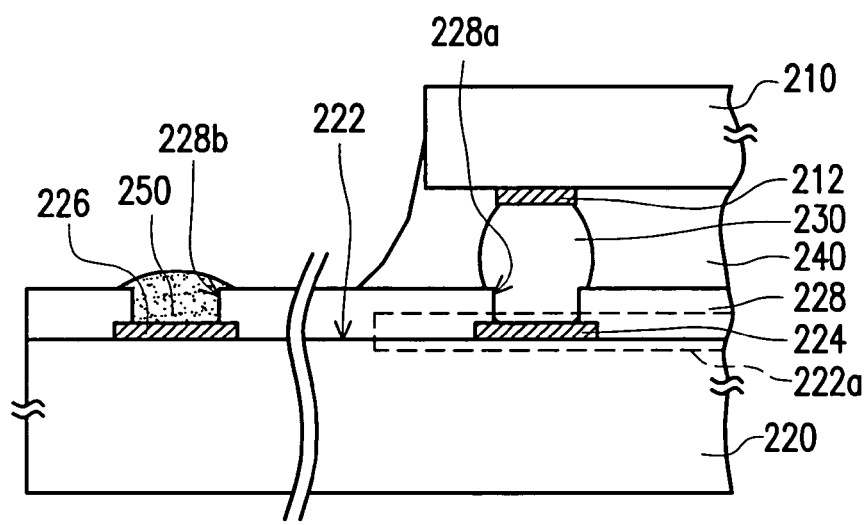
FIG. 4B is a sectional view along B–B' of FIG. 4A.
Figure 5:
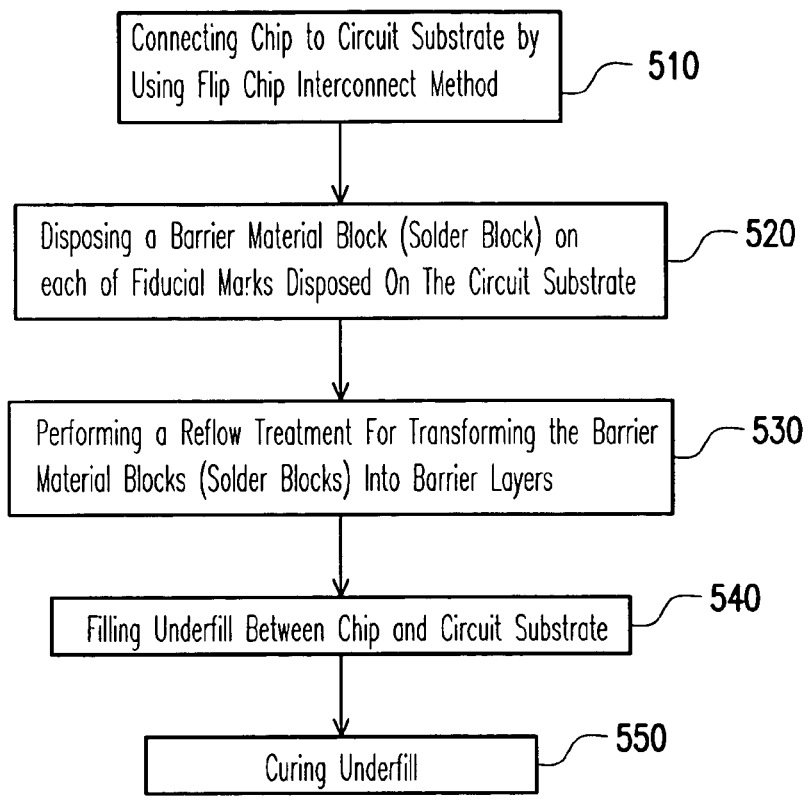
FIG. 5 is a flowchart of a first flip chip package process in accordance with an embodiment of the present invention.

Referring to FIGS. 4A, 4B and 5, wherein FIG. 4A is the bottom view of a flip chip package in accordance with an embodiment of the present invention, FIG. 4B is a sectional view along B–B' of FIG. 4A, and FIG. 5 is a flowchart of a first flip chip package process in accordance with an embodiment of the present invention.

As shown at step 510, a chip 210 is connected to a circuit substrate 220 by a flip chip interconnect method. The circuit substrate 220 has a carrier surface 222, a plurality of bump pads 224 (only one being shown), and a plurality of fiducial marks 226. The carrier surface 222 has a chip connection region 222a, wherein the bump pads 224 are disposed on the chip connection region 222a, and the fiducial marks 226 are disposed on the carrier surface 222 and are located outside the chip connection region 222a. Besides, the circuit substrate 220 has a solder mask 228, which is disposed on the carrier surface 222, and the solder mask 228 has a plurality of openings 228a, 228b exposing portions of bump pads 224 and fiducial marks 226, respectively.

Figure 3:
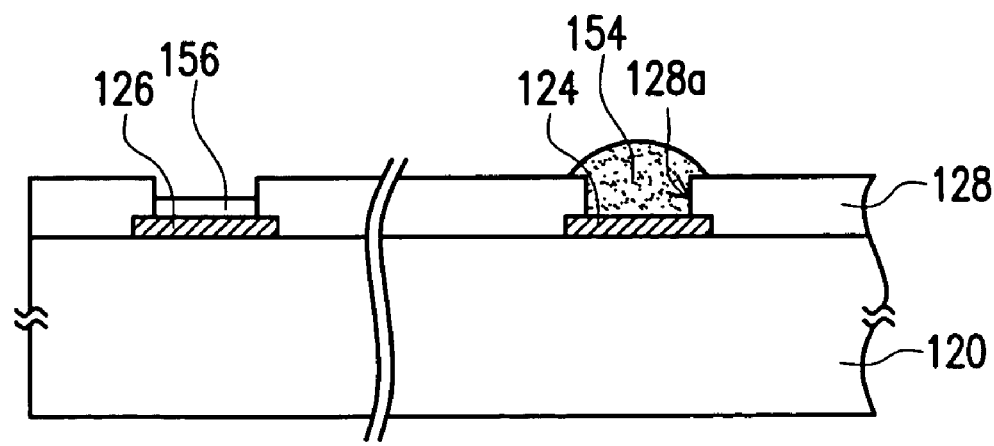
FIG. 3 is a partial sectional view of yet another conventional circuit substrate.

As described above, the fiducial marks 226, for instance, are dummy pads of the uppermost circuit layer of the circuit substrate 220, that can be connected to the power plane, ground plane, or signal 10 terminal of the circuit substrate 220. Before the chip 210 is connected to the bump pads 224, similar to the conventional circuit substrate, the bump pads 224 may be respectively formed with a solder block (such as reference 154 of FIG. 3). Each of the fiducial marks 226 may be covered with an organic protection layer (similar to the conventional reference 156 of FIG. 3). In addition, the chip 210 is located at the chip connection region 222a, and a plurality of solder pads 212 of the chip 210 are respectively electrically and mechanically connected with the bump pads 224 of the circuit substrate 220 via the bumps 230.

Next, as shown at step 520, barrier blocks, for example, solder blocks, are formed on the fiducial marks 226.

Thereafter, at step 530, a reflow step is carried out or other suitable fixing treatment is carried out to transform the solder blocks into barrier layers 250 respectively, such that the barrier layers 250 covers and fixes onto the fiducial mark 226 respectively. For example, the reflow treatment of the bumps 230 and the solder blocks can be implemented simultaneously. After the reflow treatment, the solder blocks connect the bumps 230 to the bump pads 224 respectively. Furthermore, as the solder blocks transform into corresponding barrier layers 250, the organic protection layer (not shown) originally covering the fiducial marks 226 will disappear. The barrier layers 250 are formed protruding from the surface of the solder mask 228.

Next, as shown at step 540, an underfill 240 is filled between the chip 210 and the circuit substrate 220, wherein the underfill 240 encloses the bumps 230. After that, as shown in step 550, a curing treatment is carried out so as to cure the underfill 240.

As mentioned in the above, in the first flip chip package process of the present invention, after the chip has been positioned onto the circuit substrate, solder blocks are formed on the fiducial marks and then a fixing treatment, i.e. a reflow treatment, is carried out to reflow the bumps and the solder blocks, so that the solder blocks are transformed into a plurality of barrier layers. It should be noted that the sequences of step 520 and step 530 are interchangeable, i.e., first, the bumps can be subjected to a reflow treatment, subsequently, solder blocks can be formed on the fiducial marks and then the solder blocks can be subjected to reflow treatment in order to transform the solder blocks into barrier layers. It should be noted that for other types of flip chip package process not requiring underfill between the chip and the circuit substrate, the steps 540 and 550 can be omitted. Alternatively, other types of conductive film can be also used to interconnect chip and circuit substrate. For instance, when anisotropic conductive film (ACF) is used to serve interconnection between chip and the circuit substrate, the reflow treatment of step 530 may be replaced with a curing treatment.

Figure 6:
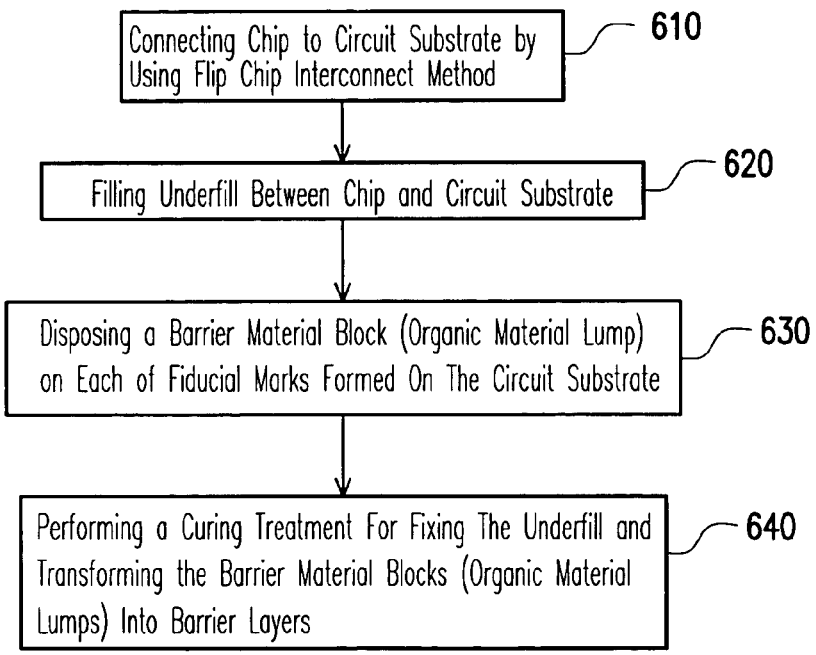
FIG. 6 is a flowchart of a second flip chip package process in accordance with an embodiment of the present invention.

According to another embodiment of the present invention, instead of using solder blocks for forming the barrier layers, organic materials may be used for forming barrier layers. Referring to FIGS. 4 and 6, wherein FIG. 6 is a flowchart of a second flip chip package process in accordance with another embodiment of the present invention.

As shown at step 610, a flip chip interconnect method is applied for connecting the chip 210 to the circuit substrate 220. When a plurality of bumps 230 is used to connect chip 210 to the circuit substrate 220, after a reflow treatment, the bumps 230 are fixed between the chip 210 and the circuit substrate 220.

Thereafter, as shown at step 620, an underfill 240 is filled between the chip 210 and the circuit substrate 220, wherein the underfill 240 encapsulates the bumps 230.

Next, as shown at step 630, a barrier blocks are respectively mounted on the fiducial marks 226, for instance, the barrier blocks comprise organic material, which could be similar or not similar to the underfill 240. When the material of the organic material is similar to the underfill 240, the equipment for forming underfill 240 can be utilized for mounting the organic blocks onto the fiducial marks 226 respectively.

Thereafter, as shown at step 640, a curing treatment or other fixing treatments is performed to fix the underfill 240 and the organic material lumps such that the organic blocks are transformed into barrier layers 250 covering and fixing onto the fiducial marks 226 respectively.

As described above, after the chip and the circuit substrate are connected to each other by flip chip interconnect method, an underfill is filled between the chip and the circuit substrate in sequence, organic blocks are mounted on each of the fiducial marks respectively mounted and then a fixing treatment is carried out to fix the underfill and transform the organic blocks into barrier layers simultaneously. It should be noted that first organic blocks are respectively mounted onto the fiducial marks and then the underfill is filled between the chip and the circuit substrate, i.e., step 630 is carried out first. Thereafter a curing treatment carried cut to cure underfill and transform the organic blocks into barrier layers. Furthermore, organic blocks comprising a material different from the material of the underfill can also be utilized or other organic materials not requiring any curing treatment can also be utilized for forming barrier layers for covering the fiducial marks.

In view of the above, in the flip chip package process according to an embodiment of the present invention, solder blocks, underfill material or any other suitable other organic materials can be utilized for forming barrier layers to cover the fiducial marks of the circuit substrate. Thus, that the barrier layers resist the fiducial marks from being exposed to external oxygen or moisture and thereby reduce the possibility of oxidation of the fiducial marks. Accordingly, the flip chip package and the packing process has the following advantages.

After the chip is positioned on the chip connection section of the circuit substrate according to the fiducial marks, solder blocks are mounted on each of the fiducial marks, and then a fixing treatment (reflow treatment) is carried out so as to fix the bumps and transform the solder blocks into barrier layers for covering the fiducial marks, respectively.

Alternatively, organic blocks comprising same material as the underfill can be mounted on the fiducial marks at the time of forming an underfill between the chip and the circuit substrate, a fixing treatment (i.e. curing treatment) can be carried out to fix the underfill and the organic blocks into barrier layers simultaneously. Thus, no extra process steps or special equipment are required for forming the barrier layers.

The barrier layers are adapted for covering the fiducial marks in order to resist exposure of fiducial marks to external oxygen and moisture so as to reduce the possibility of oxidation of the fiducial marks. Thus, the aesthetic appearance of the circuit substrate can be maintained. The circuit substrate can function normally, and the reliability of the flip chip package can be effectively promoted.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flip chip package process, comprising:
connecting a chip to a circuit substrate by using flip chip interconnect method, wherein the circuit substrate includes a carrier surface and a plurality of fiducial marks, the carrier surface includes a chip connection region, the fiducial marks are disposed onto the carrier surface and are located outside the chip connection region;
positioning the chip on the chip connection region according to the fiducial marks;
mounting a solder block on each of the fiducial marks; and
carrying out a reflow treatment for fixing the chip with the circuit substrate and transforming the solder blocks become into barrier layers covering the fiducial marks respectively.

2. The process of claim 1, wherein the flip chip interconnect method includes a plurality of bumps to connect the chip to the circuit substrate.

3. The process of claim 2, wherein the solder block and the bumps are subjected to the reflow treatment simultaneously so that the bumps are fixed between the chip and the circuit substrate.

4. The process of claim 1, further comprising a step of forming an underfill between the chip and the circuit substrate after the step of forming the barrier layers.

5. The process of claim 1, wherein before connecting the chip to the circuit substrate in the flip chip interconnect method, an organic surface protection layer (OSP) is formed on each of the fiducial marks.

6. The process of claim 1, wherein a solder mask is disposed onto the carrier surface of the circuit substrate, and wherein the fiducial marks remain exposed and the barrier layers protrude out from the surface of the solder mask.

7. A flip chip package process, comprising:
connecting a chip to a circuit substrate by using flip chip interconnect method, wherein the circuit substrate includes a carrier surface and a plurality of fiducial marks, the carrier surface includes a chip connection region, the fiducial marks are disposed onto the carrier surface outside the chip connection region;
positioning and connecting the chip on the chip connection region according to the fiducial marks;
filling an underfill between the chip and the circuit substrate and disposing an organic material block on each of the fiducial marks; and
carrying out a curing treatment to fix the underfill and transform the organic material block into a barrier layer covering each of the fiducial marks respectively.

8. The process of claim 7, wherein a material of the barrier layer is similar to that of the underfill.

9. The process of claim 7, further comprising a step of forming an organic protection layer on each of the fiducial marks before the chip is connected to the circuit substrate using the flip chip interconnect method.

10. The process of claim 7, wherein a solder mask is disposed onto the carrier surface of the circuit substrate, and wherein the fiducial marks remain exposed and the barrier layers are protruded out from the surface of the solder mask.

11. A flip chip package process, comprising:
   connecting a chip to a circuit substrate by using flip chip interconnect method, wherein the circuit substrate includes a carrier surface and a plurality of fiducial marks, the carrier surface includes a chip connection region, the fiducial marks are disposed onto the carrier surface outside the chip connection region;
   positioning the chip on the chip connection region according to the fiducial marks;
   disposing a barrier material block on each of the fiducial marks; and
   carrying out a fixing treatment to transform the barrier material block into a barrier layer for covering the fiducial marks, respectively.

12. The process of claim 11, further comprising a step of forming an organic protection layer on each of the fiducial marks before step of connecting the chip to the circuit substrate using the flip chip interconnect method.

* * * * *